United States Patent
Kim et al.

(10) Patent No.: US 10,395,921 B2
(45) Date of Patent: *Aug. 27, 2019

(54) METHOD OF FORMING THIN FILM

(71) Applicant: ASM IP Holding B.V., Almere (NL)

(72) Inventors: Young Hoon Kim, Cheonan-si (KR); Dae Youn Kim, Daejeon (KR); Seung Woo Choi, Cheonan-si (KR); Hyung Wook Noh, Anyang-si (KR); Yong Min Yoo, Seoul (KR); Hak Joo Lee, Incheon (KR)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/080,004

(22) Filed: Mar. 24, 2016

(65) Prior Publication Data

US 2016/0284534 A1 Sep. 29, 2016

(30) Foreign Application Priority Data

Mar. 25, 2015 (KR) .......................... 10-2015-0041661

(51) Int. Cl.
 *C23C 16/455* (2006.01)
 *H01L 21/02* (2006.01)
 (Continued)

(52) U.S. Cl.
 CPC ...... *H01L 21/0228* (2013.01); *C23C 16/4584* (2013.01); *C23C 16/45527* (2013.01);
 (Continued)

(58) Field of Classification Search
 CPC .. C23C 16/45525–45555; C23C 16/52; H01L 21/0228; H01L 21/02164; H01L 21/02274
 (Continued)

(56) References Cited

U.S. PATENT DOCUMENTS 7,838,072 B2 * 11/2010 Kaushal ............ C23C 16/45527
427/248.1
9,330,899 B2 * 5/2016 Jung ................. H01L 21/02219
(Continued)

OTHER PUBLICATIONS

Webster's Ninth New Collegiate Dictionary; Merriam-Webster Inc., publishers; Springfield, Massachusetts, USA; 1990 (no month); excerpt p. 339.*

*Primary Examiner* — Marianne L Padgett
(74) *Attorney, Agent, or Firm* — Knobbe Martens Olson & Bear LLP

(57) ABSTRACT

Provided is a method of forming a thin film having a target thickness T on a substrate by an atomic layer deposition (ALD) method. The method includes n processing conditions each having a film growth rate that is different from the others, and determining $a_1$ to $a_n$ that are cycles of a first processing condition to an n-th processing condition so that a value of $|T-(a_1 \times G_1 + a_2 \times G_2 + \ldots + a_n \times G_n)|$ is less than a minimum value among $G_1, G_2, \ldots,$ and $G_n$, where n is 2 or greater integer, $G_1, \ldots,$ and $G_n$ respectively denote a first film growth rate that is a film growth rate of the first processing condition, . . . and an n-th film growth rate that is a film growth rate of the n-th processing condition, and the film growth rate denotes a thickness of a film formed per a unit cycle in each of the processing conditions. The film forming method may precisely and uniformly control a thickness of the thin film when an ALD is performed.

17 Claims, 8 Drawing Sheets

(51) Int. Cl.
*C23C 16/52* (2006.01)
*C23C 16/458* (2006.01)

(52) U.S. Cl.
CPC .. *C23C 16/45536* (2013.01); *C23C 16/45542* (2013.01); *C23C 16/45544* (2013.01); *C23C 16/52* (2013.01); *H01L 21/02164* (2013.01); *H01L 21/02219* (2013.01); *H01L 21/02274* (2013.01)

(58) Field of Classification Search
USPC ........ 427/535–537, 539, 562–564, 569–579, 427/255.18, 255.17, 255.26–255.7
See application file for complete search history.

(56) References Cited

U.S. PATENT DOCUMENTS

| | | | | |
|---|---|---|---|---|
| 9,564,311 | B2* | 2/2017 | Kim | C23C 16/402 |
| 9,797,042 | B2* | 10/2017 | Nowak | C23C 16/54 |
| 9,840,776 | B2* | 12/2017 | Kapoor | H01L 21/0262 |
| 9,997,357 | B2* | 6/2018 | Arghavani | H01L 21/2225 |
| 2004/0182316 | A1* | 9/2004 | Watanabe | C23C 16/4401 |
| | | | | 118/715 |
| 2005/0220984 | A1* | 10/2005 | Sun | C23C 4/12 |
| | | | | 427/8 |
| 2009/0041952 | A1* | 2/2009 | Yoon | C23C 16/402 |
| | | | | 427/579 |
| 2010/0130024 | A1* | 5/2010 | Takasawa | C23C 16/45531 |
| | | | | 438/761 |
| 2012/0058576 | A1* | 3/2012 | Beck | C23C 16/4412 |
| | | | | 438/5 |
| 2014/0120737 | A1* | 5/2014 | Swaminathan | C23C 16/45527 |
| | | | | 438/765 |
| 2014/0120738 | A1* | 5/2014 | Jung | H01L 21/02219 |
| | | | | 438/778 |
| 2015/0093911 | A1* | 4/2015 | Nakatani | C23C 16/52 |
| | | | | 438/761 |
| 2015/0249013 | A1* | 9/2015 | Arghavani | H01L 21/2225 |
| | | | | 438/548 |
| 2015/0332912 | A1* | 11/2015 | Nowak | C23C 16/54 |
| | | | | 438/778 |
| 2015/0348854 | A1* | 12/2015 | Kapoor | H01L 21/0262 |
| | | | | 438/10 |
| 2016/0090650 | A1* | 3/2016 | Qian | C23C 16/4401 |
| | | | | 427/9 |
| 2016/0148800 | A1* | 5/2016 | Henri | H01L 21/0228 |
| | | | | 438/485 |
| 2017/0148630 | A1* | 5/2017 | Kim | H01L 21/02274 |
| 2017/0314129 | A1* | 11/2017 | Karim | C23C 16/45527 |
| 2018/0073140 | A1* | 3/2018 | Williams | C23C 16/45525 |
| 2018/0127877 | A1* | 5/2018 | Shim | C23C 16/4408 |
| 2019/0085448 | A1* | 3/2019 | Phillips | C23C 16/45527 |

* cited by examiner

METHOD OF FORMING THIN FILM

CROSS-REFERENCE TO RELATED APPLICATION

This application claims the benefit of Korean Patent Application No. 10-2015-0041661, filed on Mar. 25, 2015, in the Korean Intellectual Property Office, the disclosure of which is incorporated herein in its entirety by reference.

BACKGROUND

1. Field

One or more embodiments relate to a method of forming a thin film, and more particularly, to a thin film forming method by using an atomic layer deposition (ALD) method capable of precisely and uniformly controlling a thickness of a thin film.

2. Description of the Related Art

In manufacturing semiconductor devices, efforts to improve devices or processes of forming high quality thin films on a substrate have been continued. Recently, an atomic layer deposition (ALD) method, in which two or more reaction materials are sequentially supplied onto a substrate in a time-dividing manner to grow a thin film through a surface reaction and the above process is repeatedly performed to obtain a thin film of a desired thickness, has been suggested. In the ALD method, the reaction materials are separately supplied and the thin film is formed by a surface reaction. Therefore, according to the ALD method, a film having a uniform thickness throughout an entire surface of the substrate may be formed without regard to features on the substrate and impurities mixed in the thin film may be reduced, and a thin film having excellent properties may be obtained.

In addition, as an integration degree of semiconductor devices has increased extremely, demand for precisely controlling a thickness of a thin film during processes of manufacturing the semiconductor devices has risen. However, there are demands for a method of precisely controlling a thickness of a thin film and uniformly forming the thin film that is finally obtained by the ALD method.

SUMMARY

One or more embodiments include a method of forming a thin film by using an atomic layer deposition (ALD) method, capable of precisely and uniformly controlling a thickness of a thin film.

One or more embodiments include a method of operating an ALD apparatus capable of precisely and uniformly controlling a thickness of a thin film.

One or more embodiments include an ALD apparatus capable of precisely and uniformly controlling a thickness of a thin film.

Additional aspects will be set forth in part in the description which follows and, in part, will be apparent from the description, or may be learned by practice of the presented embodiments.

According to one or more embodiments, a thin film forming method for forming a thin film having a target thickness T on a substrate by using an atomic layer deposition, the thin film forming method includes: n cycle processing conditions each having a film growth rate that is different from the others, and determining $a_1$ to $a_n$ that are cycles of a first cycle processing condition to an n-th cycle processing condition so that a value of $|T-(a_1 \times G_1 + a_2 \times G_2 + \ldots + a_n \times G_n)|$ is less than a minimum value from among $G_1, G_2, \ldots,$ and $G_n$, where n is 2 or greater integer, $G_1, \ldots,$ and $G_n$ respectively denote a first film growth rate that is a film growth rate of the first cycle processing condition, $\ldots$ and an n-th film growth rate that is a film growth rate of the n-th cycle processing condition, and the film growth rate denotes a thickness of a film formed per a cycle unit in each of the cycle processing conditions.

The determining of $a_1$ to $a_n$ so that the value of $|T-(a_1 \times G_1 + a_2 \times G_2 + \ldots + a_n \times G_n)|$ may be less than the minimum value from among $G_1, G_2, \ldots,$ and $G_n$ may include determining $a_1$ to $a_n$ so that the value of $|T-(a_1 \times G_1 + a_2 \times G_2 + \ldots + a_n \times G_n)|$ may be less than or equal to 0.1 Å. The determining of $a_1$ to $a_n$ so that the value of $|T-(a_1 \times G_1 + a_2 \times G_2 + \ldots + a_n \times G_n)|$ may be less than the minimum value from among $G_1, G_2, \ldots,$ and $G_n$ may include determining $a_1$ to $a_n$ so that the value of $|T-(a_1 \times G_1 + a_2 \times G_2 + \ldots + a_n \times G_n)|$ may have a minimum value.

The target thickness T may not correspond to an integer multiple of any of the first film growth rate $G_1$, a second film growth rate $G_2, \ldots,$ and the n-th film growth rate $G_n$.

There may be two or more combinations of $(a_1, a_2, \ldots, a_n)$, and the film forming method may further include selecting a combination of $(a_1, a_2, \ldots, a_n)$ so that a value of $(a_1+a_2+ \ldots +a_n)$ may have a minimum value.

The minimum value of $|T-(a_1 \times G_1 + a_2 \times G_2 + \ldots + a_n \times G_n)|$ may be less than a minimum value of a difference between an integer multiple of the first film growth rate $G_1$ and the target thickness T. The minimum value of $|T-(a_1 \times G_1 + a_2 \times G_2 + \ldots + a_n \times G_n)|$ may be less than a minimum value of a difference between an integer multiple of an i-th film growth rate $G_i$ (here, i is an arbitrary integer selected between 1 to n) and the target thickness T. The condition, in which the minimum value of $|T-(a_1 \times G_1 + a_2 \times G_2 + \ldots + a_n \times G_n)|$ may be less than the minimum value of the difference between the integer multiple of the i-th film growth rate $G_i$ (here, i is an arbitrary integer selected between 1 to n) and the target thickness T, may be satisfied with respect to any integer i selected from 1 to n.

n may be 2, and the first cycle processing condition and the second cycle processing condition may be the same as each other except for a temperature. n may be 2, and the first cycle processing condition and the second cycle processing condition may be performed by using a plasma enhanced atomic layer deposition (PEALD) method. In each of the cycle processing conditions, a silicon oxide ($SiO_2$) thin film may be deposited by the PEALD method.

There may be two or more combinations of $(a_1, a_2, \ldots, a_n)$, and the film forming method may further include: calculating a uniformity of the thin film deposited on the substrate with respect to each of the two or more combinations of $(a_1, a_2, \ldots, a_n)$; and selecting a combination of $(a_1, a_2, \ldots, a_n)$ that makes an absolute value of the uniformity have a minimum value.

The determining of $a_1$ to $a_n$ so that the value of $|T-(a_1 \times G_1 + a_2 \times G_2 + \ldots + a_n \times G_n)|$ may be less than the minimum value from among $G_1, G_2, \ldots,$ and $G_n$ may include determining $a_1$ to $a_n$ so that the value of $|T-(a_1 \times G_1 + a_2 \times G_2 + \ldots + a_n \times G_n)|$ becomes less than 1.7 Å.

According to one or more embodiments, a method of operating an atomic layer deposition apparatus including an input unit, a control unit, and a driving unit, the method includes: receiving an input of a target thickness T of a thin film to be formed through the input unit; determining $a_1$ to $a_n$ that denotes cycles of n cycle processing conditions, including first to n-th cycle processing conditions, and having different film growth rates from each other by the control unit; and performing the first to n-th cycle processing conditions according to the determined cycles $a_1$ to $a_n$ by the driving unit, wherein the determining of the cycles $a_1$ to $a_n$ includes determining a combination of $(a_1, a_2, \ldots, a_n)$ so that a value of $|T-(a_1 \times G_1 + a_2 \times G_2 + \ldots + a_n \times G_n)|$ is less than a minimum value from among $G_1, G_2, \ldots,$ and $G_n$, where n is 2 or greater integer, $G_1, G_n$ respectively denote a first film growth rate that is a film growth rate of the first cycle processing condition, . . . and an n-th film growth rate that is a film growth rate of the n-th cycle processing condition, and the film growth rate denotes a thickness of a film formed per a cycle unit in each of the cycle processing conditions.

The film growth rate $G_1$ of the first cycle processing condition, . . . , and the film growth rate $G_n$ of the n-th cycle processing condition may be stored in a memory unit, and the film growth rates stored in the memory unit may be read by the control unit in order to determine the combination of $(a_1, a_2, \ldots, a_n)$ so that the value of $|T-(a_1 \times G_1 + a_2 \times G_2 + \ldots + a_n \times G_n)|$ may be the minimum value in the determining of the cycles $a_1$ to $a_n$.

The first cycle processing condition, . . . , and the n-th cycle processing condition may be different from each other in a temperature, flow rates of a source gas and a reaction gas, or an applied plasma power.

There may be two or more combinations of $(a_1, a_2, \ldots, a_n)$, a uniformity $W_1$ of the thin film deposited in the first cycle processing condition, . . . , and a uniformity $W_n$ of the thin film deposited in the n-th cycle processing condition are stored in the memory unit, and the determining of the combination of $(a_1, a_2, \ldots, a_n)$ by the control unit may include: reading from the memory unit the uniformity $W_1, \ldots,$ or $W_n$ of the thin film in each of the first to n-th cycle processing conditions by the control unit; and selecting a combination of $(a_1, a_2, \ldots, a_n)$ that makes an absolute value of $W_T$ in an equation $W_T = (a_1 \times W_1 + a_2 \times W_2 + \ldots + a_n \times W_n)$ have a minimum value.

According to one or more embodiments, an atomic layer deposition apparatus includes an input unit, a controller, a memory, and a driver, wherein the controller is configured to select a combination of $(a_1, a_2, \ldots, a_n)$ that makes a value of $|T-(a_1 \times G_1 + a_2 \times G_2 + \ldots + a_n \times G_n)|$ less than a minimum value from among $G_1, G_2, \ldots,$ and $G_n$, from a target thickness T received through the input unit, a film growth rate $G_1$ of a first cycle processing condition, a film growth rate $G_2$ of a second cycle processing condition, . . . , and a film growth rate $G_n$ of an n-th cycle processing condition read from the memory unit. The driver may execute supply of a first material, a second material, and a purge gas in order to perform the first cycle processing condition for $a_1$ cycles, the second cycle processing condition for $a_2$ cycles, . . . , and the n-th cycle processing condition for $a_n$ cycles according to a control of the control unit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
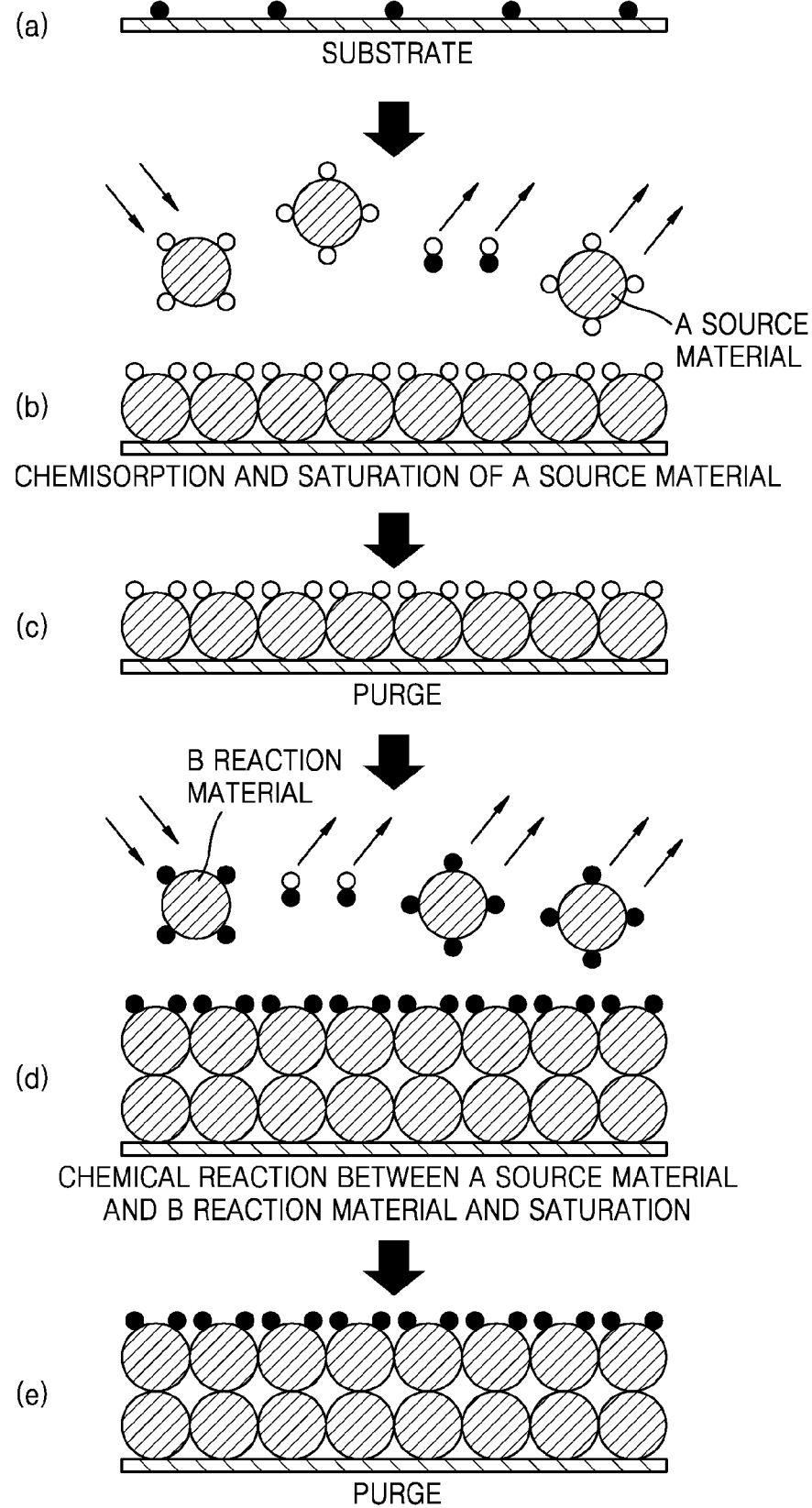
FIG. 1 is a conceptual diagram schematically illustrating a reaction principle in an atomic layer deposition (ALD) method with respect to one cycle.

The present disclosure will now be described more fully with reference to the accompanying drawings, in which exemplary embodiments of the present disclosure are shown. The present disclosure may, however, be embodied in many different forms by one of ordinary skill in the art without departing from the technical teaching of the present disclosure. In other words, particular structural and functional description of the present disclosure are provided in descriptive sense only; various changes in form and details may be made therein and thus should not be construed as being limited to the embodiments set forth herein. As the present disclosure is not limited to the embodiments described in the present description, and thus it should not be understood that the present disclosure includes every kind of variation examples or alternative equivalents included in the spirit and scope of the present disclosure.

In the present description, terms such as 'first', 'second', etc. are used to describe various elements. However, it is obvious that the elements should not be defined by these terms. The terms are used only for distinguishing one element from another element. For example, a first element may be termed a second element, and similarly, a second element may be termed a first element, without departing from the teaching of the present disclosure.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list. As used herein, the term "and/or" includes any and all combinations of one or more of the associated listed items. Expressions such as "at least one of," when preceding a list of elements, modify the entire list of elements and do not modify the individual elements of the list.

FIG. 1 is a conceptual diagram schematically illustrating a reaction principle in an atomic layer deposition (ALD) method with respect to one cycle. According to the ALD method, an A source material is supplied to a surface of a substrate so that the A source material may be chemisorbed on the surface of the substrate, and when the surface of the substrate is saturated by the A source material, an excessive amount of the A source material is purged from a chamber, to be removed. Next, a B reaction material is supplied to generate a surface reaction between the A source material that is chemisorbed on the surface and the B reaction material, and then, an excessive amount of the B reaction material is purged.

In more detail, in operation (a), a substrate is disposed in a reaction chamber for atomic layer deposition, and in operation (b), the A source material is supplied as a gas phase to be chemisorbed on the surface of the substrate. Through such above chemisorptions, a monolayer of the A source material may be formed on the surface of the substrate in a self-limiting manner, and an excessive amount of the A source material does not react with the surface of the substrate.

In operation (c), the excessive amount of the A source material is purged from the reaction chamber and removed by using an inert gas, and in operation (d), the B reaction material is supplied into the reaction chamber. The B reaction material reacts with the A source material that is chemisorbed on the surface of the substrate. Through the above chemical reaction on the surface of the substrate, a desired thin film may be formed on the substrate from the A source material and the B reaction material.

In addition, in operation (e), an excessive amount of the B reaction material that remains without reacting with the A source material is purged from the reaction chamber and removed by using an inert gas. Here, a binary atomic layer deposition using two kinds of source material/reaction material is exemplary described, but the atomic layer deposition using more source materials/reaction materials may be performed in the same manner as above.

Processes from operation (a) to operation (e) are referred to as a cycle, and the cycle may be repeatedly executed until a thin film of a desired thickness may be obtained.

However, the thickness of the thin film, which increases according to repetition of the cycles, is not increased continuously, but may be increased in a discrete manner as much as a thickness of a thin film monolayer.

Figure 2:
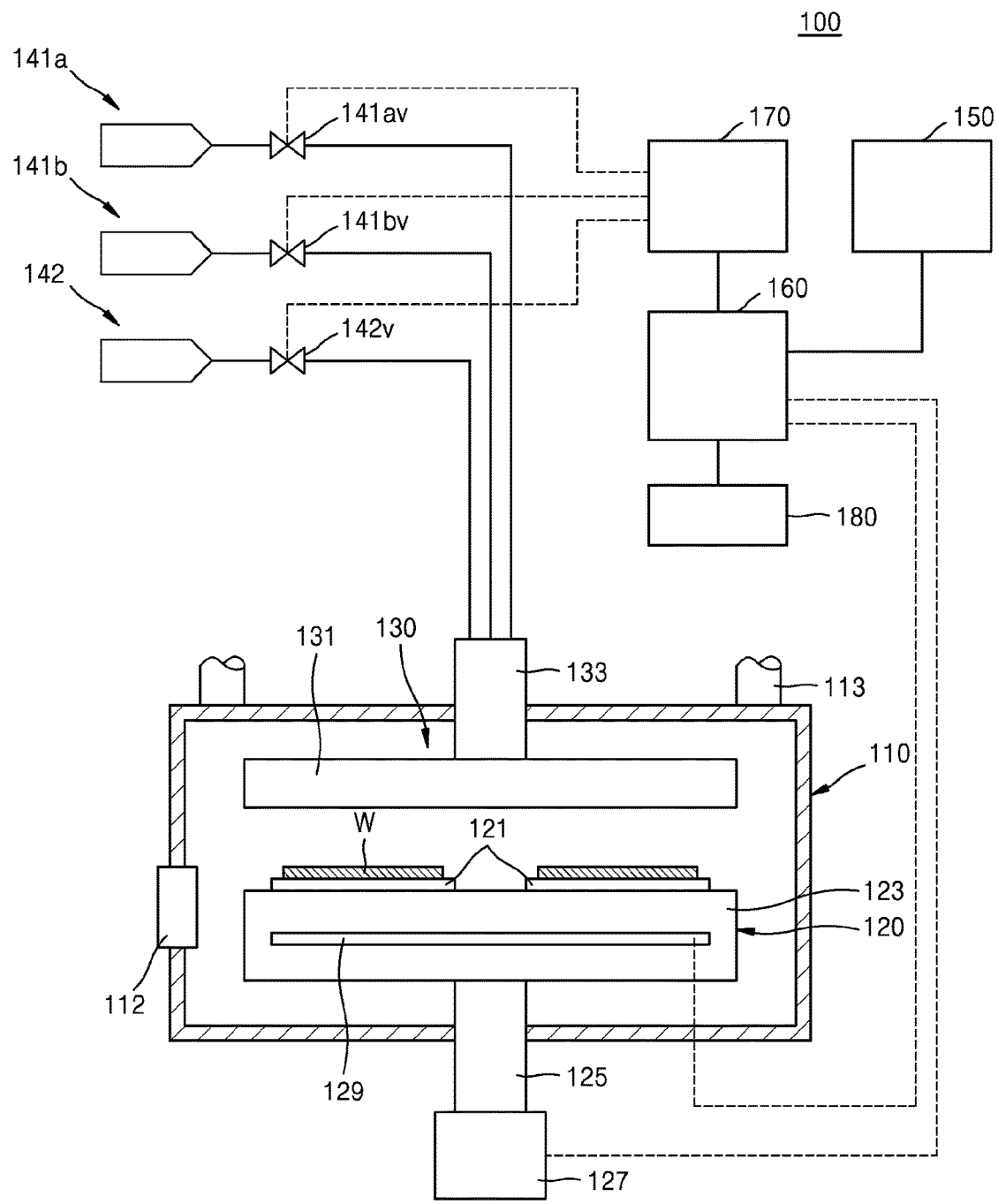
FIG. 2 is a conceptual diagram of an ALD apparatus according to an embodiment.

FIG. 2 is a conceptual diagram of an ALD apparatus 100 according to an embodiment.

Referring to FIG. 2, the ALD apparatus 100 may include a reaction chamber 110, a support member 120, a spray member 130, a supply member 140, an input unit 150, a controller 160, a driver 170, and a memory unit 180.

An import/export gate 112 is provided at a side of the reaction chamber 110. Substrates W enter/exit the import/export gate 112 for performing deposition processes. In addition, the reaction chamber 110 may further include an exhaust duct 113 for exhausting a reaction gas, a purge gas, or reaction by-products. Although not shown in FIG. 2, the exhaust duct 113 may be provided to a vacuum pump, and may include a pressure control valve, a flux control valve, etc.

The support member 120 is provided in the reaction chamber 110. The support member 120 may be configured to place one or more substrates thereon. The support member 120 may include a table 123 of a disc shape, on which stages 121 on which substrates are placed are formed, and a support pillar 125 supporting the table 123. The stages 121 may have circular shapes. When the support member 120 is configured to place a plurality of substrates, there are provided a plurality of stages 121 that are arranged at a constant interval therebetween. The support member 120 may be rotated by a rotating portion 127. The number of revolutions and a rotating speed of the rotating portion 127 that makes the support member 120 rotate are controlled by a rotary motor that is controlled by a controller that will be described later.

The spray member 130 spays the gas to each of the substrates W placed on the support member 120. The spray member 130 receives the reaction gas and the purge gas from the supply member 140, and sprays the gases onto a processing surface of the each substrate W at a location corresponding to each of the substrates W. The spray member 130 includes a head 131 for spraying the gas, and a shaft 133 provided penetrating an upper center portion of the reaction chamber 110 and supporting the head 131. The head 131 may be formed as a disc, and may include gas supplying holes on a lower surface thereof.

The supply member 140 may include a first material supply member 141a, a second material supply member 141b, and a purge gas supply member 142. The first material supply member 141a and the second material supply member 141b respectively supply a first material and a second material onto the substrates W, and the purge gas supply member 142 supplies the purge gas onto the substrates W.

The first material supply member 141a, the second material supply member 141b, and the purge gas supply member 142 may respectively include control valves 141av, 141bv, and 142v for controlling the supply of the first material, the second material, and the purge gas.

Opening/closing of the control valves 141av, 141bv, and 142v may be actuated by the driver 170 according to a control of the controller 160. The driver 170 may be controlled by a hydraulic pressure or a pneumatic pressure. This will be described in more detail later.

Figure 3A:
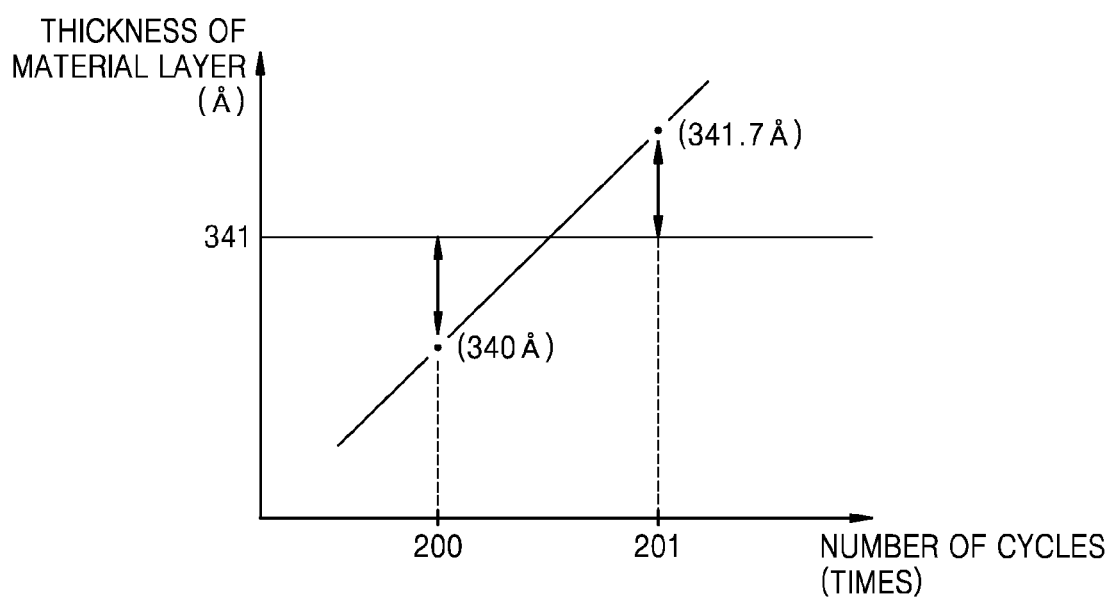
FIG. 3A is a graph of a variation in a thickness of a thin film obtained when cycles are repeated under a single processing condition.

When it is desired to form a thin film having a target thickness T by using a conventional ALD apparatus, an accuracy of forming the target thickness T has been restricted by a thickness of a monolayer in the thin film. FIG. 3A is a graph of a variation in a thickness of a thin film that is obtained by repeating cycles under a single processing condition. Referring to FIG. 3A, if a thin film having a target thickness of 341 Å is to be formed by using an ALD apparatus under a deposition condition having a film growth rate of 1.7 Å/cycle, a thickness of 340 Å is obtained when 200 cycles have been repeated and a thickness of 341.7 Å is obtained when 201 cycles have been repeated. That is, when 200 cycles are repeated, the thickness is 1 Å less than the target thickness, and when one further cycle is added, the thickness of 341.7 Å that is 0.7 Å greater than the target thickness.

Therefore, an error of at least 0.7 Å inevitably occurs, and the accuracy in the thickness of the thin film has been restricted by the thickness of the monolayer in the thin film, that is, a thickness obtained per one cycle.

However, the Inventors of the inventive concept found that an accuracy of the thickness of the thin film may be greatly improved by combining a plurality of cycles having different film growth rates from one another.

For example, a first processing condition having a film growth rate of 1.7 Å/cycle and a second processing condition having a film growth rate of 1.8 Å/cycle may be combined to form a thin film having a thickness of 341 Å. That is, 10 cycles may be performed under the first processing condition and 180 cycles may be performed under the second processing condition, or 28 cycles may be performed under the first processing condition and 163 cycles may be performed under the second processing condition, in order to obtain a thin film having a thickness that is closer to the target thickness than the thickness obtained under the single processing condition under which it is difficult to obtain a target thickness due to the difference of one cycle. Here, the 'processing condition' is defined as a processing condition of one entire cycle through which a monolayer of a material layer to be formed may be obtained.

Figure 3B:
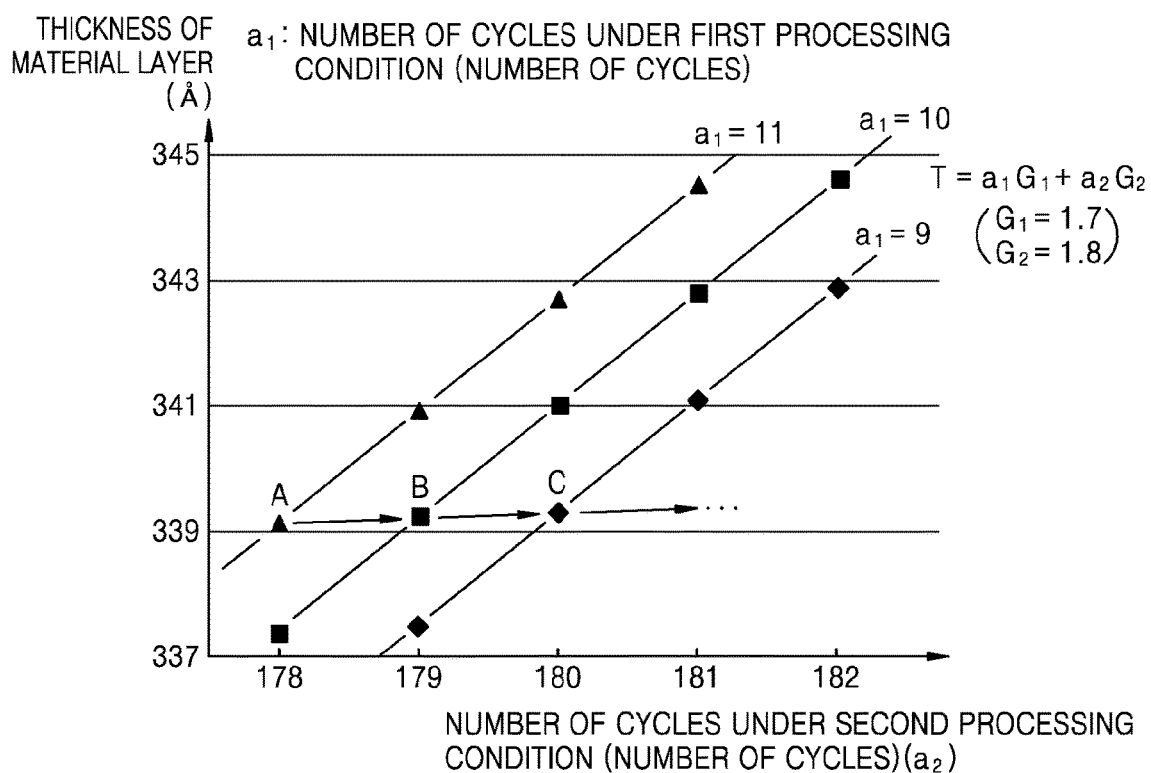
FIG. 3B is a graph of a variation in a thickness of a thin film obtained when two processing conditions having different film growth rates from each other are combined.

FIG. 3B is a graph of a variation in a thickness of a thin film when two processing conditions having different film growth rates $G_1$ and $G_2$ are combined.

Referring to FIG. 3B, when a first processing condition having the first film growth rate $G_1$ is repeated nine times ($a_1=9$) and a second processing condition having the second film growth rate $G_2$ is repeated 180 times ($a_2=180$), a thin film thickness of 339.3 Å is obtained. Then, when the second processing condition is repeated one more time ($a_2=181$), a thin film thickness of 341.1 Å may be obtained.

However, when the first processing condition having the first film growth rate $G_1$ is repeated ten times ($a_1=10$) and the second processing condition having the second film growth rate is repeated 179 times ($a_2=179$), a thin film thickness of 339.2 Å is obtained. Then, the second processing condition is repeated one more time ($a_2=180$), a thin film thickness of 341.0 Å may be obtained, which is perfectly equal to the target thickness, that is, 341 Å. Moreover, a thin film thickness (A) obtained by repeating the first processing condition 11 times and the second processing condition 178 times, a thin film thickness (B) obtained by repeating the first processing condition 10 times and the second processing condition 179 times, and a thin film thickness (C) obtained by repeating the first processing condition 9 times and the second processing condition 180 times are respectively 339.1 Å, 339.2 Å, and 339.3 Å. That is, the thickness of the thin film may be controlled by 0.1 Å unit. That is, cycles of the two different processing conditions are appropriately combined such that the thin film thickness may be more precisely controlled in a 0.5 Å unit or 0.1 Å unit that is smaller than 1 to 2 Å unit in the deposition method according to the prior art. Therefore, the thickness of the thin film may be controlled with an accuracy that is greatly improved than that under the single processing condition.

In the above description, the target thickness of the thin film is described as being obtained when two processing conditions having film growth rates that are known are combined, but this may be expanded to n kinds of processing conditions having known film growth rates (here, n is 2 or greater integer).

That is, when it is assumed that n processing conditions having different film growth rates from one another, that is, the first processing condition, . . . , and an n-th processing condition, are known and the film growth rates of the n processing conditions are the first film growth rate $G_1$, . . . , and an n-th film growth rate $G_n$, cycles of each of the n processing conditions are adjusted to obtain a thin film having the target thickness T or a thickness closest to the target thickness T.

In other words, when cycles of the first processing condition, the second processing condition, . . . , and the n-th processing condition for forming the thin film having the target thickness T are respectively $a_1, a_2, \ldots, a_n$, a thickness of a thin film that is actually formed is $(a_1 \times G_1 + a_2 \times G_2 + \ldots + a_n \times G_n)$. Therefore, the thickness of the thin film may be accurately controlled by reducing a difference between the thickness of the obtained thin film and the target thickness T as small as possible, or to be smaller than a minimum value among $G_1, G_2, \ldots, G_n$.

That is, the number of cycles of the first processing condition, the second processing condition, . . . , and the n-th processing condition may be determined as a combination of $a_1, a_2, \ldots, a_n$, such that a value of $|T-(a_1 \times G_1 + a_2 \times G_2 + \ldots + a_n \times G_n)|$ (an absolute value of value of $T-(a_1 \times G_1 + a_2 \times G_2 + \ldots + a_n \times G_n)$) is less than a minimum value among $G_1, G_2, \ldots,$ and $G_n$. Here, $a_1, a_2, \ldots, a_n$ each denotes the number of cycles of each processing condition, that is, an integer of 0 or greater. As such, the thickness of the thin film may be controlled with higher accuracy than that of thin film formed by simply repeating a single processing condition with one film growth rate.

Moreover, $a_1, a_2, \ldots, a_n$ may be determined as a combination of $(a_1, a_2, \ldots, a_n)$ that makes the value of $|T-(a_1 \times G_1 + a_2 \times G_2 + \ldots + a_n \times G_n)|$ (that is, the absolute value of $T-(a_1 \times G_1 + a_2 \times G_2 + \ldots + a_n \times G_n)$) equal to or less than 0.1 Å or have a minimum value. As such, the thickness of the thin film may be controlled more precisely.

Here, the target thickness T does not correspond to an integer multiple of any of the first film growth rate $G_1$, a second film growth rate $G_2$, . . . , and the n-th film growth rate $G_n$. If the target thickness T may correspond to an integer multiple of one of the first film growth rate $G_1$, a second film growth rate $G_2$, . . . , and the n-th film growth rate $G_n$ (e.g., an i-th film growth rate of an i-th processing condition), the i-th processing condition is only repeated by integer multiple times to obtain the target thickness.

In one embodiment, the combination of $(a_1, a_2, \ldots, a_n)$ may be determined so that the value of $|T-(a_1 \times G_1 + a_2 \times G_2 + \ldots + a_n \times G_n)|$ is equal to 0.1 Å or less. Moreover, in another embodiment, the combination of $(a_1, a_2, \ldots, a_n)$ may be determined so that the value of $|T-(a_1 \times G_1 + a_2 \times G_2 + \ldots + a_n \times G_n)|$ is 0. In another embodiment, there may be no combination of $(a_1, a_2, \ldots, a_n)$ that makes the value of $|T-(a_1 \times G_1 + a_2 \times G_2 + \ldots + a_n \times G_n)|$ equal to or less than 0.1 Å, but a combination of $(a_1, a_2, \ldots, a_n)$ that makes the value of $|T-(a_1 \times G_1 + a_2 \times G_2 + \ldots + a_n \times G_n)|$ have a minimum value may be determined.

The minimum value of $|T-(a_1 \times G_1 + a_2 \times G_2 + \ldots + a_n \times G_n)|$ is less than a minimum value of a difference between an integer multiple of the i-th film growth rate (here, i is an arbitrary integer between 1 to n) and the target thickness T. That is, the minimum value of $|T-(a_1 \times G_1 + a_2 \times G_2 + \ldots + a_n \times G_n)|$ is less than a minimum value of a difference between an integer multiple of the first film growth rate and the target thickness T, and is also less than a minimum value of a difference between an integer multiple of the second film growth rate and the target thickness T. Moreover, the minimum value of $|T-(a_1 \times G_1 + a_2 \times G_2 + \ldots + a_n \times G_n)|$ is less than a minimum value of a difference between an integer multiple of any of third to n-th film growth rates and the target thickness T.

For example, the combination of $(a_1, a_2, \ldots, a_n)$ may be determined so that the value of $|T-(a_1 \times G_1 + a_2 \times G_2 + \ldots + a_n \times G_n)|$ may be less than 1.7 Å.

Figure 4:
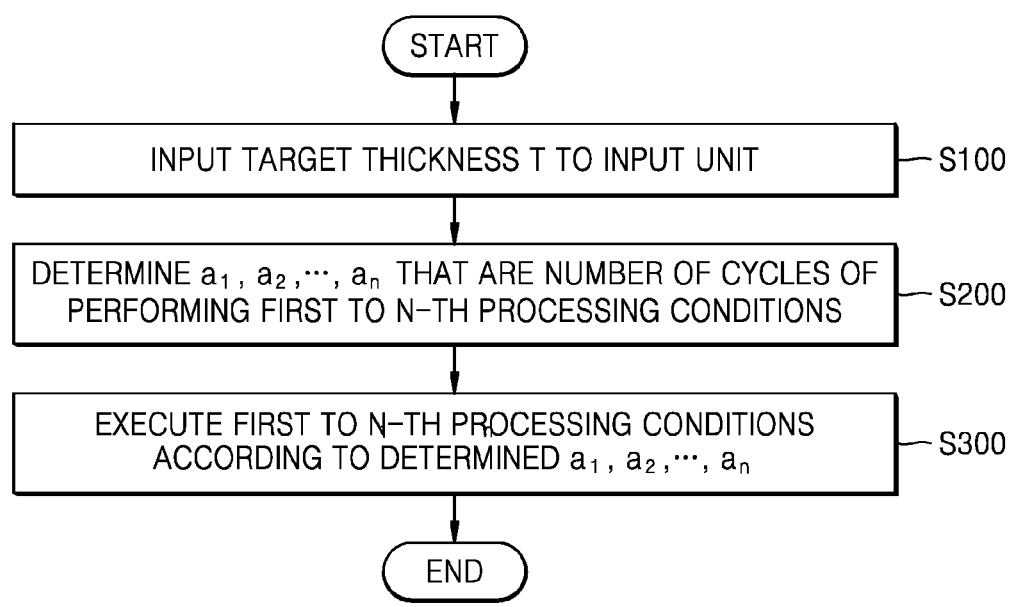
FIG. 4 is a flowchart of a method of forming a thin film according to an embodiment.

FIG. 4 is a flowchart of a thin film forming method according to an embodiment in a processing order.

Referring to FIGS. 2 and 4, a target thickness T of a thin film to be formed on a substrate W may be input through the input unit 150 (S100). The input unit 150 may be a keyboard, a touchscreen, or other input devices that may be manipulated by an operator. Otherwise, the input unit 150 may be a data receiving device that may receive data transmitted from other equipment. That is, the target thickness T input to the input unit 150 may be manually input by the operator, or may be automatically input by other equipment.

The target thickness T may be directly transmitted to the controller 160, or may be stored in the memory 180 and then read out by the controller 160 according to a call.

Next, the controller 160 reads the film growth rate $G_1$ of the first processing condition, the film growth rate $G_2$ of the second processing condition, . . . , and the film growth rate $G_n$ of the n-th processing condition from the memory 180, and then, may determine the number of cycles of the first processing condition, the second processing condition, . . . , and the n-th processing condition, that is, $a_1, a_2, \ldots, a_n$ by reading out film growth rates (S200).

The film growth rates of the first processing condition to the n-th processing condition may finely vary according to a temperature at which a deposition process is performed, flow rates of a source gas and a reaction gas, and a magnitude of supplied plasma power. That is, the first processing condition to the n-th processing condition have different process recipes from each other. With respect to each of the first to n-th processing conditions, the recipe that may represent the film growth rate corresponding to each of the first to n-th processing conditions may be determined in advance and stored in the memory 180.

Figure 5:
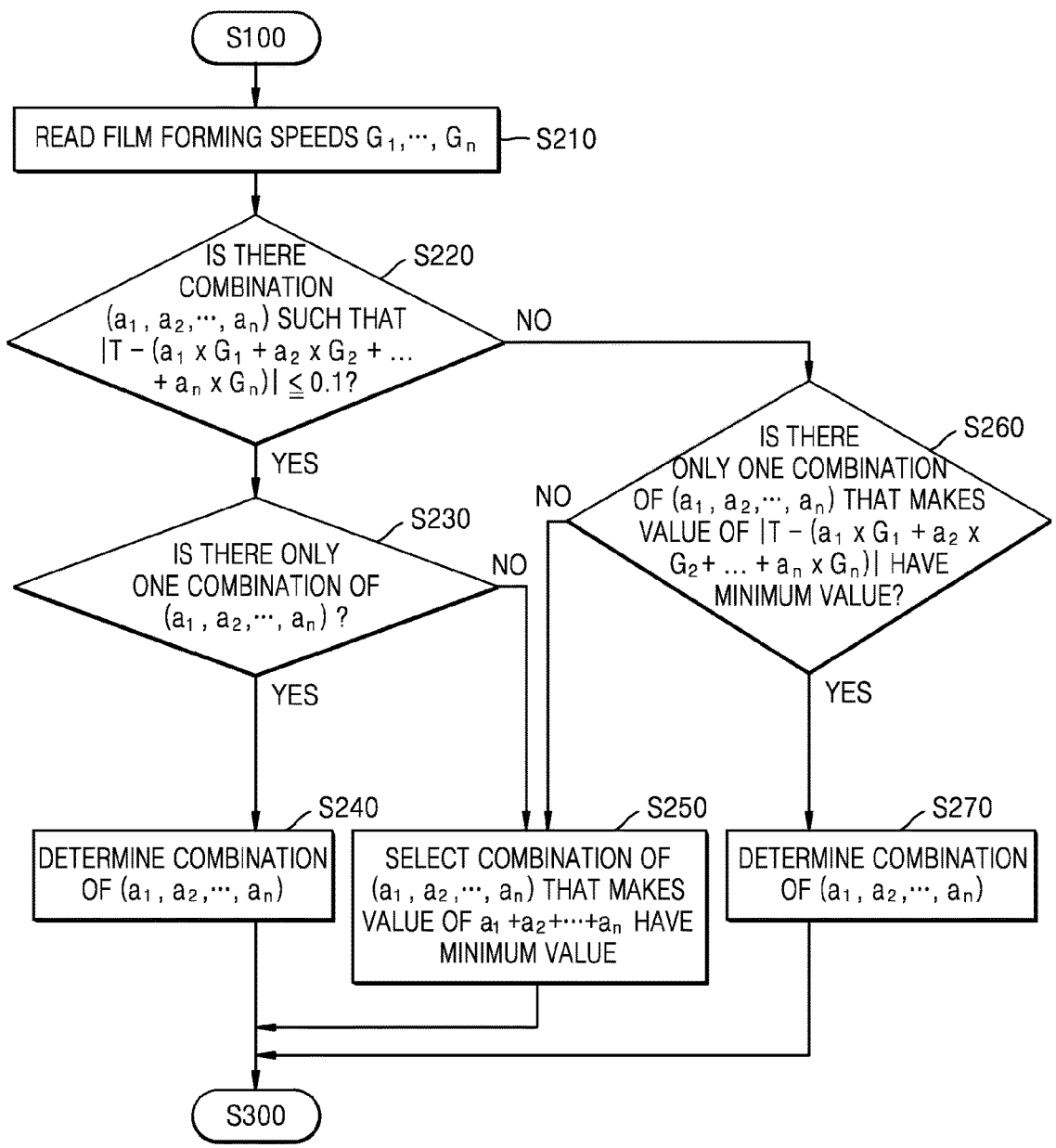
FIG. 5 is a flowchart illustrating a method of determining the number of cycles, $a_1, a_2, \ldots, a_n$ of a first processing condition to an n-th processing condition from a film growth rate $G_1$ of the first processing condition, a film growth rate $G_2$ of the second processing condition, . . . , and a film growth rate $G_n$ of the n-th processing condition, in more detail.

FIG. 5 is a flowchart illustrating a method of determining the number of cycles, $a_1, a_2, \ldots, a_n$ of the first to n-th processing conditions from the film growth rate $G_1$ of the first processing condition, the film growth rate $G_2$ of the second processing condition, . . . , and the film growth rate $G_n$ of the n-th processing condition, in more detail.

Referring to FIG. 5, the film growth rate $G_1$ of the first processing condition, the film growth rate $G_2$ of the second processing condition, . . . , and the film growth rate $G_n$ of the n-th processing condition stored in the memory 180 are read out from the memory 180 (S210), and it is checked whether there is a combination of $(a_1, a_2, \ldots, a_n)$ that makes the value $|T-(a_1 \times G_1 + a_2 \times G_2 + \ldots + a_n \times G_n)|$ equal to or less than 0.1 Å (S220).

When there is a Combination of $(a_1, a_2, \ldots, a_n)$ that Makes the Value of $|T-(a_1 \times G_1 + a_2 \times G_2 + \ldots + a_n \times G_n)|$ Equal to or Less than 0.1 Å

If there is a combination of $(a_1, a_2, \ldots, a_n)$ that makes the value of $|T-(a_1 \times G_1 + a_2 \times G_2 + \ldots + a_n \times G_n)|$ equal to or less than 0.1 Å, for example, 0, it is checked whether there is only one combination of $(a_1, a_2, \ldots, a_n)$ (S230). If there is only one combination of $(a_1, a_2, \ldots, a_n)$, that combination of $(a_1, a_2, \ldots, a_n)$ may be determined as a final combination (S240).

However, when it is checked whether there is only one combination of $(a_1, a_2, a_n)$ (S230), if there are a plurality of combinations of $(a_1, a_2, \ldots, a_n)$, it is necessary to select one of the plurality of combinations. There may be various strategies for selecting one of the plurality of combinations of $(a_1, a_2, \ldots, a_n)$.

For example, in one embodiment, a combination of $(a_1, a_2, \ldots, a_n)$ may be selected so that a value of $(a_1 + a_2 + \ldots + a_n)$ may have a minimum value, among the combinations of $(a_1, a_2, \ldots, a_n)$ that makes the value of $|T-(a_1 \times G_1 + a_2 \times G_2 + \ldots + a_n \times G_n)|$ equal to or less than 0.1 Å, for example, 0 (S250). By selecting in the above manner, the number of cycles that are entirely performed (that is, $a_1 + a_2 + \ldots + a_n$) may have a minimum value, and accordingly, manufacturing costs may be reduced and a throughput per hour may be improved.

In another embodiment, from among the combinations of $(a_1, a_2, \ldots, a_n)$ that makes the value of $|T-(a_1 \times G_1 + a_2 \times G_2 + \ldots + a_n \times G_n)|$ equal to or less than 0.1 Å, a combination in which the number of cycles $a_i$ (i is an integer between 1 to n) of the i-th processing condition having the lowest process temperature is the largest may be selected. As such, a ratio of the cycle consuming less energy may rise, and accordingly, manufacturing costs may be reduced.

In another embodiment, a combination of $(a_1, a_2, \ldots, a_n)$ may be selected so that a uniformity of the thin film formed on the substrate may be optimized, among the combinations of $(a_1, a_2, \ldots, a_n)$ that makes the value of $|T-(a_1 \times G_1 + a_2 \times G_2 + \ldots + a_n \times G_n)|$ equal to or less than 0.1 Å.

When the thin film is formed on a semiconductor substrate, the uniformity of the thin film may vary depending on a deposition condition. For example, a thin film having a concave portion in the center of the film may be formed or a thin film having a convex portion in the center of the film may be formed, based on an upper surface of the thin film formed on the semiconductor substrate. Therefore, the thin film may be uniform and the thickness of the thin film may be controlled more precisely by minimizing the above type of deposition.

To this end, uniformity information of the thin film with respect to each processing condition as well as the film growth rates $G_1, G_2, \ldots, G_n$ of the first to n-th processing conditions, may be stored in the memory 180 in advance, and the combination of $(a_1, a_2, \ldots, a_n)$ may be selected so as to optimize the uniformity of the thin film by using the information stored in the memory 180. In more detail, the degrees of uniformity of the thin film $(W_1, \ldots, W_n)$ obtained when the first to n-th processing conditions are performed one time are obtained in advance, and then, may be stored in the memory 180 with the film growth rates $G_1$ to $G_n$. Values of $W_1$ to $W_n$ representing the degrees of uniformity of the thin film may be positive numbers or negative numbers according to a deposition type of the thin film. That is, based on the upper surface of the substrate, when the thin film is formed concavely, the above value of $W_1$ to $W_n$ may have the positive value, and when the thin film is formed convexly, the above value of $W_1$ to $W_n$ may have the negative value. In another embodiment, when the thin film is formed concavely with respect to the upper portion of the substrate, the above value of $W_1$ to $W_n$ may be defined as the negative number, and when the thin film is formed convexly with respect to the upper portion of the substrate, the above value of $W_1$ to $W_n$ may be defined as the positive number.

Next, a predicted total degrees of uniformity $W_T$ may be calculated through a formula $(a_1 \times W_1 + a_2 \times W_2 + \ldots + a_n \times W_n)$, with respect to each of the plurality of combinations of $(a_1, a_2, \ldots, a_n)$ that makes the value of $|T-(a_1 \times G_1 + a_2 \times G_2 + \ldots + a_n \times G_n)|$ equal to or less than 0.1 Å. However, the above total degrees of uniformity $W_T$ of the thin film may not be calculated only through the above formula, but may be calculated by various empirical formulae, instead of the above formula.

Next, the values of $W_T$ calculated with respect to each of the combinations of $(a_1, a_2, \ldots, a_n)$ are compared with one another so as to select a combination of $(a_1, a_2, \ldots, a_n)$, in which an absolute value of $W_T$ may be the smallest.

One of ordinary skill in the art would appreciate that there may be various strategies in addition to the above-described strategies.

If there is a Combination of $(a_1, a_2, \ldots, a_n)$ that Makes the Value of $|T-(a_1 \times G_1 + a_2 \times G_2 + \ldots + a_n \times G_n)|$ Equal to or Less than 0.1 Å

If there is no combination of $(a_1, a_2, \ldots, a_n)$ that makes the value of $|T-(a_1 \times G_1 + a_2 \times G_2 + \ldots + a_n \times G_n)|$ equal to or less than 0.1 Å, a combination of $(a_1, a_2, \ldots, a_n)$ that makes the value of $|T-(a_1 \times G_1 + a_2 \times G_2 + \ldots + a_n \times G_n)|$ have the minimum value, may be selected.

By selecting the combination of $(a_1, a_2, \ldots, a_n)$ so that the value of $|T-(a_1 \times G_1 + a_2 \times G_2 + \ldots + a_n \times G_n)|$ may have the minimum value, a difference between the target thickness T and the thickness of the thin film that is actually formed, that is, $(a_1 \times G_1 + a_2 \times G_2 + \ldots + a_n \times G_n)$, may have a minimum value.

In addition, even when the combination of $(a_1, a_2, \ldots, a_n)$ is selected so that the value of $|T-(a_1 \times G_1 + a_2 \times G_2 + \ldots + a_n \times G_n)|$ may have the minimum value because there is no combination of $(a_1, a_2, \ldots, a_n)$ that makes the value of $|T-(a_1 \times + a_2 \times G_2 + \ldots + a_n \times G_n)|$ equal to or less than 0.1 Å, there may be an issue about whether the above combination of $(a_1, a_2, \ldots, a_n)$ is unique or not.

If there is only one combination of $(a_1, a_2, \ldots, a_n)$ that makes the value of $|T-(a_1 \times G_1 + a_2 \times G_2 + \ldots + a_n \times G_n)|$ have the minimum value, the combination may be determined as a final combination of $(a_1, a_2, \ldots, a_n)$ (S270).

However, in a case where there may be two or more combinations of $(a_1, a_2, \ldots, a_n)$ that make the value of $|T-(a_1 \times G_1 + a_2 \times G_2 + \ldots + a_n \times G_n)|$ have the minimum value, the combination of $(a_1, a_2, \ldots, a_n)$ may be selected according to various strategies.

For example, in one embodiment, from among the plurality of combinations of $(a_1, a_2, \ldots, a_n)$ that make the value of $|T-(a_1 \times G_1 + a_2 \times G_2 + \ldots + a_n \times G_n)|$ have the minimum value, a combination of $(a_1, a_2, \ldots, a_n)$ that makes a value of $(a_1 + a_2 + \ldots + a_n)$ have the minimum value may be selected (S250). As such, the number of entire cycles (that is, $(a_1 + a_2 + \ldots + a_n)$) may be minimized, and thus, manufacturing costs may be reduced and the throughput may be improved.

In another embodiment, from among the plurality of combinations of $(a_1, a_2, \ldots, a_n)$ that make the value of $|T-(a_1 \times G_1 + a_2 \times G_2 + \ldots + a_n \times G_n)|$ have the minimum value, a combination in which a value of $a_i$ (i is an integer between 1 to n), that is, the number of cycles of performing the i-th processing condition having the lowest processing temperature has the maximum value may be selected. As such, a ratio of the processing condition consuming less energy may rise, and manufacturing costs may be improved.

In another embodiment, a combination of $(a_1, a_2, \ldots, a_n)$ may be selected so that the uniformity of the thin film formed on the semiconductor substrate may be optimized, among the combinations of $(a_1, a_2, \ldots, a_n)$ that make the value of $|T-(a_1 \times + a_2 \times G_2 + \ldots + a_n \times G_n)|$ have the minimum value.

To this end, uniformity information of the thin film with respect to the each processing condition, as well as the film growth rates $G_1, \ldots, G_n$ of the first to n-th processing conditions, is stored in the memory 180 in advance, and the combination of $(a_1, a_2, \ldots, a_n)$ may be selected so that the uniformity of the thin film may be optimized. In more detail, the uniformity of the thin film obtained when the first to n-th processing conditions are performed one time is obtained as $W_1, \ldots, W_n$ in advance, and then, may be stored in the memory 180 with the film growth rates $G_1, \ldots, G_n$.

Next, an expected total degree of uniformity $W_T$ may be calculated by using an equation $(a_1 \times W_1 + a_2 \times W_2 + \ldots + a_n \times W_n)$ with respect to each of the plurality of combinations of $(a_1, a_2, \ldots, a_n)$ that make the value of $|T-(a_1 \times G_1 + a_2 \times G_2 + \ldots + a_n \times G_n)|$ have the minimum value. In some embodiment, however, the total degree of uniformity may be calculated by using various empirical formulae, instead of using the above equation only.

Next, the values of $W_T$ calculated with respect to each of the combinations of $(a_1, a_2, \ldots, a_n)$ are compared with one another so as to select a combination of $(a_1, a_2, \ldots, a_n)$ that makes an absolute value of $W_T$ have the minimum value.

One of ordinary skill in the art would appreciate that there are various strategies, in addition to the above-described strategy.

The determining of the combination of $(a_1, a_2, \ldots, a_n)$ may be performed by, for example, the controller 160. In addition, whether there is the combination of $(a_1, a_2, \ldots, a_n)$ that makes the value of $|T-(a_1 \times G_1 + a_2 \times G_2 + \ldots + a_n \times G_n)|$ equal to or less than 0.1 Å, the combination of $(a_1, a_2, \ldots, a_n)$ that satisfies the above condition, and the combination of $(a_1, a_2, \ldots, a_n)$ that makes the value of $|T-(a_1 \times G_1 + a_2 \times G_2 + \ldots + a_n \times G_n)|$ have the minimum value if there is no combination of $(a_1, a_2, \ldots, a_n)$ that makes the above value equal to or less than 0.1 Å may be easily obtained by one of ordinary skill in the art by using a simple numerical analysis programming or a commercial mathematics package.

Referring to FIGS. 2 and 4, in order to form the thin film having the target thickness T, the first to n-th processing conditions may be performed based on the determined combination of $(a_1, a_2, \ldots, a_n)$. That is, the first to n-th processing conditions may be performed according to the number of cycles $a_1$ to $a_n$.

The controller 160 may control the driver to open and close the control valves 141av, 141bv, and 142v, so that the each processing condition may be performed according to the determined number of cycle $a_1, a_2, \ldots,$ or $a_n$. In some embodiment, the controller 160 may transmit a control signal to a temperature controller 129 provided in the table 123 in order to control the temperature of the substrate W mounted in the reaction chamber 110.

Figure 6:
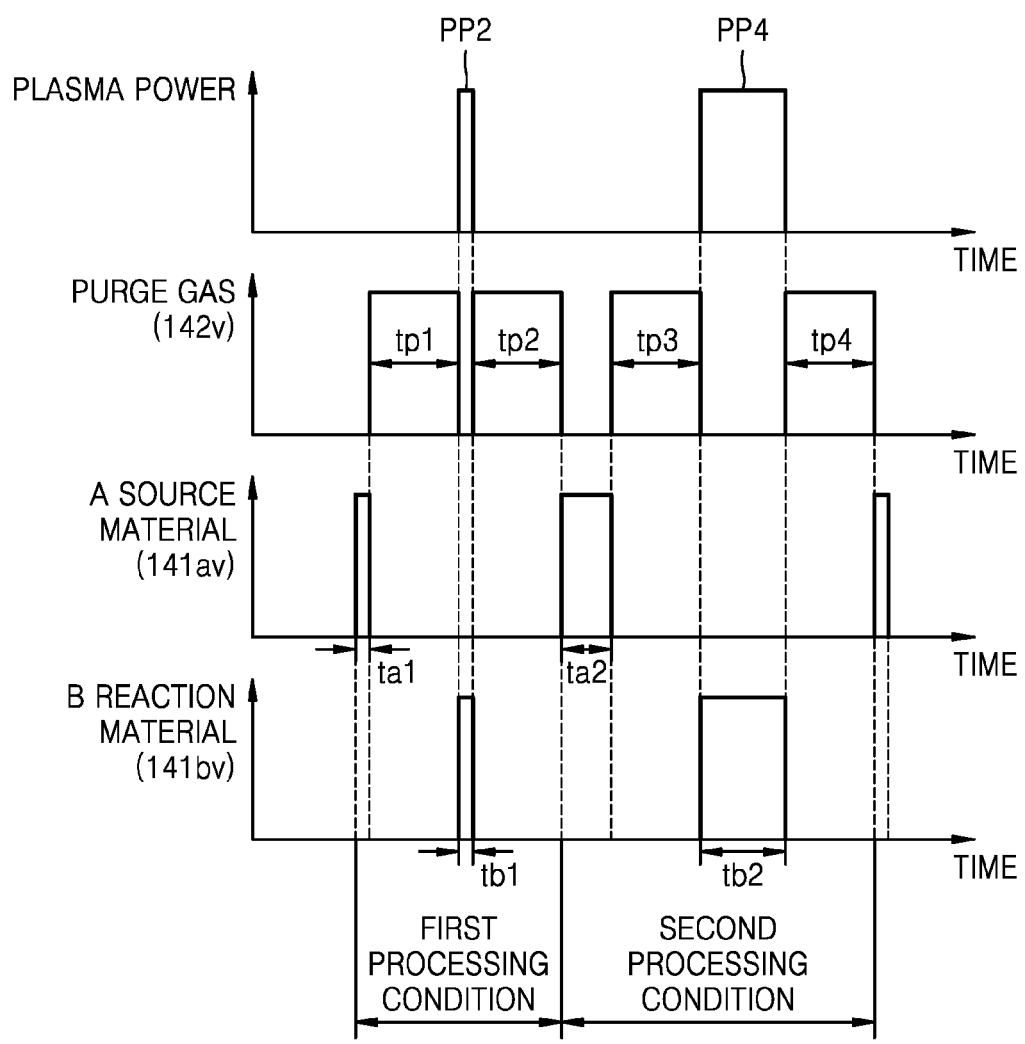
FIG. 6 is a timing diagram illustrating operations of control valves and supply of plasma while two different processing conditions are successively executed, according to an embodiment.

FIG. 6 is a timing diagram illustrating operations of the control valves 141av, 141bv, and 142v and application of plasma while two different processing conditions are successively performed, according to an embodiment.

Referring to FIG. 6, the first processing condition and the second processing condition are successively executed. During the first processing condition, the control valve 141av may be open for a time period ta1 in order to supply an A source material. During that time period, the A source material may be chemisorbed on the substrate.

In addition, an excessive amount of the A source material may be purged by the purge gas and removed from the reaction chamber. The control valve 142v may be open for a time period tp1 in order to supply the purge gas for purging the excessive amount of the A source material. During that time period, a plasma power may not be supplied.

Next, the control valve 141 by may be open for a time period tb1 in order to supply a B reaction material. Here, the plasma power may be supplied in order to activate the B reaction material with respect to the A source material (PP2). During the time period, the B reaction material may react with the A source material that has chemisorbed on the substrate in order to form a monolayer of a thin film that is to be formed.

Next, an excessive amount of the B reaction material may be purged by the purge gas and removed from the reaction chamber. The control valve 142v may be open for a time period tp2 in order to supply the purge gas for purging the excessive amount of the B reaction material.

In FIG. 6, the first processing condition is executed once and then the second processing condition is executed, but in another embodiment, the first processing condition may be executed successively two or more times.

Referring to FIG. 6, the first processing condition is followed by the second processing condition. Under the second processing condition, the control valve 141av may be open for a time period ta2 in order to supply the A source material. During that time period, the A source material may be chemisorbed on the thin film formed under the first processing condition. Here, an example in which the time period ta2 for supplying the A source material under the second processing condition is different from the time period ta1 for supplying the A source material under the first condition is provided, but in another embodiment, the time periods for supplying the A source material under the first and second processing conditions may be equal to each other and another processing condition such as a temperature or a plasma power may be different.

In addition, an excessive amount of the A source material may be purged by the purge gas and removed from the reaction chamber. The control valve 142v may be open for a time period tp3 in order to supply the purge gas for purging the excessive amount of the A source material. During that time period, the plasma power may not be supplied.

Next, the control valve 141 by may be open for a time period tb2 in order to supply the B reaction material. Here, a plasma power may be supplied in order to activate the B reaction material with respect to the A source material (PP4). During that time period, the B reaction material reacts with the A source material that has been chemisorbed on the thin film in order to form a monolayer of the thin film to be formed.

Next, an excessive amount of the B reaction material may be purged by the purge gas and removed from the reaction chamber. The control valve 142v may be open for a time period tp4 in order to supply the purge gas for purging the excessive amount of the B reaction material.

Figure 7:
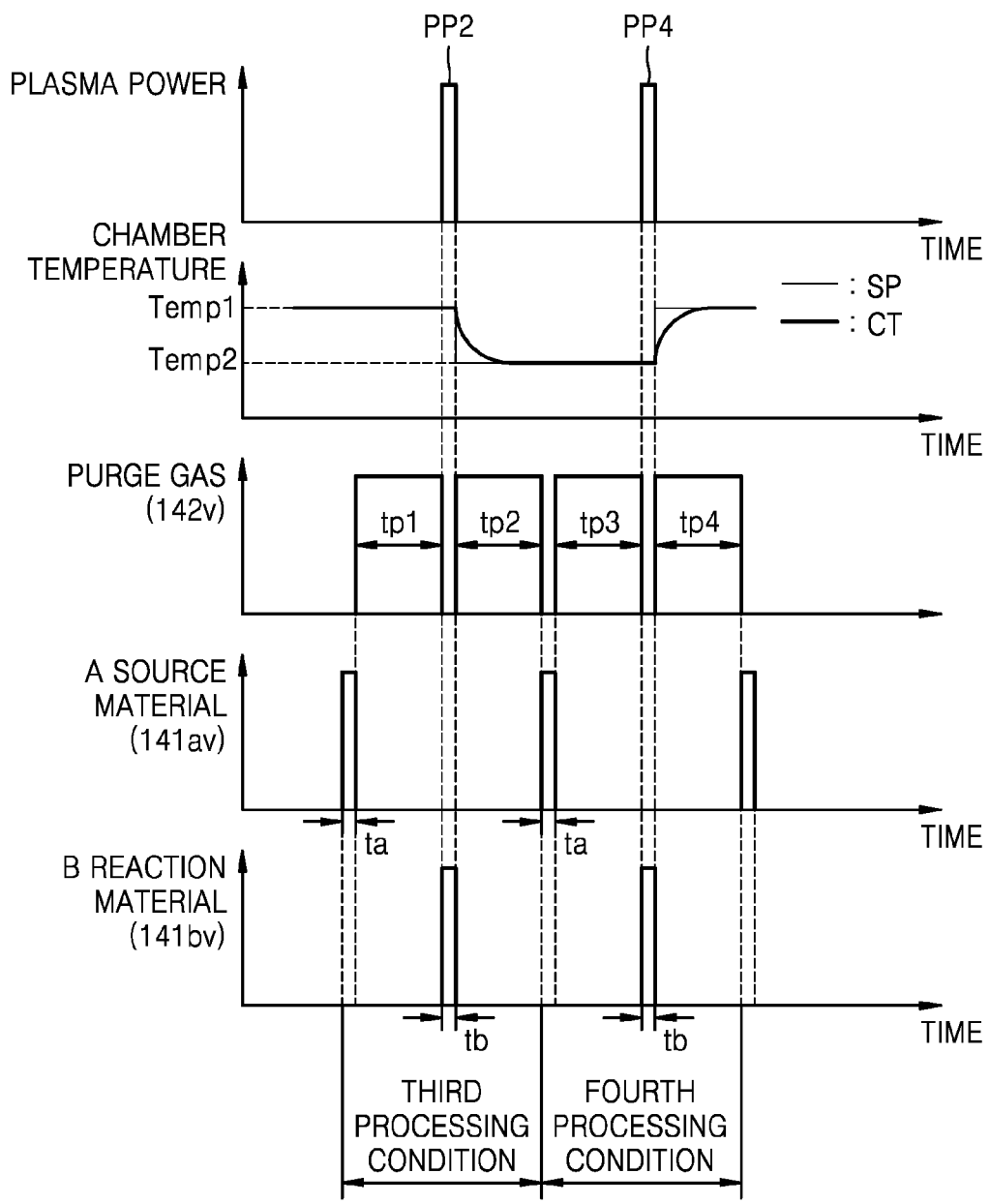
FIG. 7 is a timing diagram illustrating operations of control valves, supply of the plasma, and a temperature of a reaction chamber while two different processing conditions are successively executed, according to another embodiment.

FIG. 7 is a timing diagram illustrating operations of the control valves 141av, 141bv, and 142v, supply of the plasma, and a temperature of the reaction chamber while two different processing conditions are successively performed, according to another embodiment.

Referring to FIG. 7, the third processing condition and the fourth processing condition are successively performed. The control valve 141av may be open for a time period to in order to supply the A source material under the third processing condition. During that period of time, the A source material may be chemisorbed on the substrate. In addition, the above chemisorption reaction may occur at a chamber temperature Temp1.

Next, an excessive amount of the A source material may be purged by the purge gas and removed from the reaction chamber. The control valve 142v may be open for a time period tp1 in order to supply the purge gas for purging the excessive amount of the A source material. During that period of time, the plasma power may not be supplied.

In addition, the control valve 141 by may be open for a time period tb in order to supply the B reaction material.

Here, the plasma power may be supplied in order to activate the B reaction material (PP2). During that period of time, the B reaction material reacts with the A source material that has been chemisorbed on the substrate to form a monolayer of a thin film that is to be formed. In addition, the temperature of the reaction chamber may maintain at the temperature Temp1.

Next, an excessive amount of the B reaction material is purged by the purge gas and removed from the reaction chamber. The control valve 142v may be open for a time period tp2 in order to supply the purge gas for purging the excessive amount of the B reaction material. When the purge process starts, the temperature of the reaction chamber may be changed to a temperature Temp2 that is a processing temperature of the fourth processing condition. That is, in order to switch the chamber temperature to the temperature Temp2 before starting the next fourth processing condition, a set point (SP) of the chamber temperature may be set at the temperature Temp2 at an initial stage of the purge process. Then, the chamber temperature (CT) may be switched from Temp1 to Temp2 while the purge process is performed. Alternatively, the purge process may be performed for a sufficient period of time to switch the chamber temperature CT to the temperature Temp2.

Under the fourth processing condition, the control valve 141av may be open for a time period to for supplying the A source material. During that period of time, the A source material may be chemisorbed on the thin film formed in the third processing condition. The above chemisorptions may be performed at the chamber temperature Temp2.

In addition, an excessive amount of the A source material may be purged by the purge gas and removed from the reaction chamber. The control valve 142v may be open for a period of time tp3 for supplying the purge gas for purging the excessive amount of the A source material. During that period of time, the plasma power may not be supplied.

Next, the control valve 141 by may be open for a time period tb in order to supply the B reaction material. Here, the plasma power may be supplied in order to activate the B reaction material (PP4). During that period of time, the B reaction material reacts with the A source material that has been chemisorbed on the thin film so as to form a monolayer of the thin film that is to be formed. In addition, the temperature of the reaction chamber may maintain at the temperature Temp2.

In addition, an excessive amount of the B reaction material is purged by the purge gas and removed from the reaction chamber. The control valve 142v may be open for a period of time tp4 in order to supply the purge gas for purging the excessive amount of the B reaction material. When the purge process starts, the chamber temperature CT may be switched to the temperature Temp1 that is the processing temperature of the following third processing condition. That is, in order to switch the chamber temperature CT to Temp1 before starting the next third processing condition, the set point SP of the chamber temperature CT may be changed to Temp1 at an initial stage of the purge process. Then, the chamber temperature CT may be switched from Temp2 to Temp1 during the purge process. Alternatively, the purge process may be performed for a sufficient period of time to switch the chamber temperature CT to Temp1.

Appropriate control parameters are necessary to be set in order not to generate an excessive overshoot or undershoot when the chamber temperature CT is changed. For example, when a proportional/integral/differential (PID) controller is used to control the temperature, appropriate proportional/integral/differential parameters have to be set.

The third processing condition and the fourth processing condition may have the same conditions, except the chamber temperature CT. That is, the thin film having the target thickness or the thickness closest to the target thickness may be obtained by combining the film growth rates that are slightly different from each other due to the chamber temperature CT.

When 143 cycles were repeated to form a $SiO_2$ thin film in a PEALD method while changing the temperature from 50.0° C. to 51.0° C. by 0.1° C. unit, a film growth rate per cycle may be obtained as shown in Table 1 below.

TABLE 1

| temperature | Growth rate per cycle (Å/cycle) | Thickness obtained after 143 cycles (Å) |
|---|---|---|
| 50.0 | 1.7523 | 250.6 |
| 50.1 | 1.7520 | 250.5 |
| 50.2 | 1.7517 | 250.5 |
| 50.3 | 1.7514 | 250.5 |
| 50.4 | 1.7511 | 250.4 |
| 50.5 | 1.7508 | 250.4 |
| 50.6 | 1.7505 | 250.3 |
| 50.7 | 1.7502 | 250.3 |
| 50.8 | 1.7499 | 250.2 |
| 50.9 | 1.7496 | 250.2 |
| 51.0 | 1.7493 | 250.1 |

Here, the thickness obtained after 143 cycles is rounded off the numbers to two decimal places, and thus, even when the numbers with respect to two different temperatures are the same as each other, the actual thicknesses may differ from each other.

As shown in Table 1 above, by changing the temperature by 0.1° C., the growth rate per cycle, that is, the film growth rate, may vary slightly. For example, when a $SiO_2$ thin film having a thickness of 250.4 Å is to be formed, the thin film having the exact thickness may be formed by combining the processing condition performed at a temperature of 50.3° and the processing condition performed at a temperature of 50.4° C.

As described above, the thin film having a desired target thickness may be formed easily by combining two or more deposition cycles having different film growth rates from each other. In particular, by controlling the number of performing each of the two or more deposition cycles, the thin film having the desired thickness may be manufactured with an accuracy level of 1 Å or less. For example, when a $SiO_2$ thin film is to be formed at a substrate temperature 50° C. by a PEALD method using a bis-diethyl amino silane (BDEAS) precursor and oxygen radicals, a conventional plasma atomic layer deposition condition (source supply/purge/$O_2$ radical supply/purge) has a film growth rate of 1.7 to 1.8 Å/cycle, but in the inventive concept, a thickness of the thin film may be controlled precisely by 1 Å or less, or 0.5 Å to 0.1 Å, through the appropriate combination of the processing conditions having different film growth rates. In addition, since the deposition temperature is changed within a temperature range in which the properties of the thin film may maintain, effects that are the same as those of the single processing condition may be obtained. In addition, the thin film having excellent flatness may be obtained by combining different conditions having different thin film uniformities from each other.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A thin film forming method for forming a thin film of a material using anatomic layer deposition (ALD) process, comprising:
   providing a substrate on which the thin film of the material is to be formed;
   providing a target thickness T of the thin film;
   determining, at a processor device, n processing conditions that respectively have predetermined film growth rates ($G_1$, $G_2$, ..., and $G_n$) different from each other, where n is 2 or a greater integer, and wherein each of the film growth rates represents a thickness of the thin film formed by growth of the material per ALD cycle in each of the processing conditions;
   determining, at the processor device, a minimum value among the film growth rates $G_1$, $G_2$, ..., and $G_n$;
   repeatedly calculating, at the processor device, values of ($a_1 \times G_1 + a_2 \times G_2 + ... + a_n \times G_n$) using different sets of the numbers of the ALD) cycles ($a_1$, $a_2$, ... $a_n$) until a value of $|T-(a_1 \times G_1 + a_2 \times G_2 + ... + a_n \times G_n)|$ is less than the minimum value, wherein each of $a_1$, $a_2$, ... $a_n$ is an integer of 1 or greater and at least two of $a_1$, $a_2$, ... $a_n$ are different from each other; and
   performing, after the repeatedly calculating, deposition on the substrate using the determined numbers of ALD cycles ($a_1$, $a_2$, ... $a_n$) and the n processing conditions so as to form the thin film of the material.

2. The thin film forming method of claim 1, wherein the numbers of the ALD cycles ($a_1$, $a_2$, ..., $a_n$) are determined such that the value of $|T-(a_1 \times G_1 + a_2 \times G_2 + ... + a_n \times G_n)|$ is less than or equal to 0.1 Å.

3. The thin film forming method of claim 1, wherein the determining of the numbers of the ALD cycles ($a_1$, $a_2$, ..., $a_n$) comprises:
   determining two or more combinations of ($T-(a_1 \times G_1 + a_2 \times G_2 + ... + a_n \times G_n)$); and
   selecting a combination of ($T-(a_1 \times G_1 + a_2 \times G_2 + ... + a_n \times G_n)$) such that the value of $|T-(a_1 \times G_1 + a_2 \times G_2 + ... + a_n \times G_n)|$ has the minimum value.

4. The film forming method of claim 1, wherein the target thickness T is different from an integer multiple of any of the film growth rates $G_1$, $G_2$, ..., $G_n$.

5. The film forming method of claim 4, wherein the determining of the numbers of the ALD cycles ($a_1$, $a_2$, ..., $a_n$) comprises:
   determining two or more combinations of the numbers of the ALD cycles ($a_1$, $a_2$, ..., $a_n$); and
   selecting a combination of the numbers of the ALD cycles ($a_1$, $a_2$, ..., $a_n$) so that the value of ($a_1 + a_2 + ... + a_n$) has a minimum value.

6. The film forming method of claim 3, wherein the minimum value of $|T-(a_1 \times G_1 + a_2 \times G_2 + ... + a_n \times G_n)|$ is less than a minimum value of a difference between an integer multiple of any one of the film growth rate $G_1$, $G_2$, ..., $G_n$) and the target thickness T.

7. The film forming method of claim 6, wherein the minimum value of $|T-(a_1 \times G_1 + a_2 \times G_2 + ... + a_n \times G_n)|$ is less than a minimum value of a difference between an integer multiple of an i-th film growth rate $G_i$ (here, i is an arbitrary integer selected between 1 to n) and the target thickness T.

8. The film forming method of claim 7, wherein the condition, in which the minimum value of $|T-(a_1 \times G_1 + a_2 \times G_2 + \ldots + a_n \times G_n)|$ is less than the minimum value of the difference between the integer multiple of the i-th film growth rate $G_i$ (here, i is an arbitrary integer selected between 1 to n) and the target thickness T, is satisfied with respect to any integer i selected from 1 to n.

9. The film forming method of claim 1, wherein n is 2, and the first processing condition and the second processing condition are the same as each other except for a temperature.

10. The film forming method of claim 1, wherein n is 2, and the first processing condition and the second processing condition are performed by using a plasma enhanced atomic layer deposition (PEALD) method.

11. The film forming method of claim 10, wherein in each of the processing conditions, a silicon oxide ($SiO_2$) thin film is deposited by the PEALD method.

12. The film forming method of claim 1, wherein the determining of the numbers of the ALD cycles ($a_1$, $a_2$, ..., $a_n$) comprises:
  determining two or more combinations of the numbers of the ALD cycles ($a_1$, $a_2$, ..., $a_n$);
  calculating a uniformity of the thin film deposited on the substrate with respect to each of the two or more combinations of the numbers of the ALD cycles ($a_1$, $a_2$, ..., $a_n$); and
  selecting a combination of the numbers of the ALD cycles ($a_1$, $a_2$, ..., $a_n$) that makes an absolute value of the uniformity have a minimum value.

13. The film forming method of claim 1, wherein $a_1$ to $a_n$ are determined such that the value of $|T-(a_1 \times G_1 + a_2 \times G_2 + \ldots + a_n \times G_n)|$ becomes less than 1.7 Å.

14. A method of operating an atomic layer deposition (ALD) apparatus, the method comprising:
  receiving an input of a target thickness T of a thin film of a material to be formed through an input unit of the atomic layer deposition apparatus;
  determining, at a control unit of the atomic layer deposition apparatus, n processing conditions that respectively have predetermined film growth rates ($G_1$, $G_2$, ..., and $G_n$) different from each other, where n is 2 or a greater integer, and wherein each of the film growth rates represents a thickness of the thin film formed by growth of the material per ALD cycle in each of the processing conditions;
  determining, at the control unit, a minimum value among the film growth rates $G_1$, $G_2$, ..., and $G_n$;
  repeatedly calculating, at the control unit, values of ($a_1 \times G_1 + a_2 \times G_2 + \ldots + a_n \times G_n$) using different sets of the numbers of the ALD cycles ($a_1$, $a_2$, ..., $a_n$) until a value of $|T-(a_1 \times G_1 + a_2 \times G_2 + \ldots + a_n \times G_n)|$ is less than the minimum value, wherein each of $a_1$, $a_2$, ..., $a_n$ is an integer of 1 or greater and at least two of $a_1$, $a_2$, ..., $a_n$ are different from each other; and
  performing, after the repeatedly calculating, at a driving unit of the atomic layer deposition apparatus, deposition on the substrate using the determined numbers of the ALD cycles ($a_1$, $a_2$, ..., $a_n$) and the n processing conditions so as to form the thin film of the material.

15. The method of claim 14, wherein the film growth rates ($G_1$, $G_2$, ..., and $G_n$) are stored in the memory unit and read by the control unit in order to determine the combination of ($a_1$, $a_2$, ..., $a_n$) so that the value of $|T-(a_1 \times G_1 + a_2 \times G_2 + \ldots + a_n \times G_n)|$ is the minimum value in the determining of the cycles $a_1$ to $a_n$.

16. The method of claim 14, wherein the first processing condition, ..., and the n-th processing condition are different from each other in a temperature, flow rates of a source gas and a reaction gas, or a supplied plasma power.

17. The method of claim 15, wherein there are two or more combinations of the numbers of the ALD cycles ($a_1$, $a_2$, ..., $a_n$), a uniformity $W_1$ of the thin film deposited in the first processing condition, ..., and a uniformity $W_n$ of the thin film deposited in the n-th processing condition are stored in the memory unit, and the determining of the combination of the numbers of the ALD cycles ($a_1$, $a_2$, ..., $a_n$) by the control unit comprises:
  reading from the memory unit the uniformity $W_1$, ..., or $W_n$ of the thin film in each of the first to n-th processing conditions by the control unit; and
  selecting a combination of the numbers of the ALD cycles ($a_1$, $a_2$, ..., $a_n$) that makes an absolute value of $W_T$ in an equation $W_T = (a_1 \times W_1 + a_2 \times W_2 + \ldots + a_n \times W_n)$ have a minimum value.

* * * * *